United States Patent
Watabe et al.

(10) Patent No.: US 10,298,419 B2
(45) Date of Patent: May 21, 2019

(54) LOW VOLTAGE DIFFERENTIAL SIGNALING DRIVER

(71) Applicants: Yuji Watabe, Osaka (JP); Hiroaki Kyogoku, Hyogo (JP); Nobunari Tsukamoto, Osaka (JP)

(72) Inventors: Yuji Watabe, Osaka (JP); Hiroaki Kyogoku, Hyogo (JP); Nobunari Tsukamoto, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 15/795,927

(22) Filed: Oct. 27, 2017

(65) Prior Publication Data
US 2018/0139076 A1    May 17, 2018

(30) Foreign Application Priority Data

Nov. 17, 2016  (JP) .................................. 2016-223706
Jun. 26, 2017  (JP) .................................. 2017-124068

(51) Int. Cl.
| H03L 5/00 | (2006.01) |
| H04L 25/02 | (2006.01) |
| H03K 19/0185 | (2006.01) |
| H03K 17/687 | (2006.01) |
| H03L 7/093 | (2006.01) |
| G06F 1/06 | (2006.01) |
| H03K 5/135 | (2006.01) |
| H03L 7/081 | (2006.01) |

(52) U.S. Cl.
CPC .............. *H04L 25/028* (2013.01); *G06F 1/06* (2013.01); *H03K 5/135* (2013.01); *H03K 17/687* (2013.01);

(Continued)

(58) Field of Classification Search
CPC ... H04L 25/028; H04L 25/0272; H03L 7/081; H03L 7/098; G06F 1/06; H03K 5/136; H03K 17/687; H03K 19/018528
(Continued)

(56) References Cited

U.S. PATENT DOCUMENTS

| 6,356,141 B1* | 3/2002 | Yamauchi ............... G05F 3/262 |
| | | 323/312 |
| 6,600,346 B1* | 7/2003 | Macaluso ........... H04L 25/0272 |
| | | 326/83 |

(Continued)

FOREIGN PATENT DOCUMENTS

| JP | 2004-289354 | 10/2004 |
| JP | 2004-336236 | 11/2004 |

(Continued)

*Primary Examiner* — Dinh T Le
(74) *Attorney, Agent, or Firm* — Oblon, McClelland, Maier & Neustadt, L.L.P.

(57) ABSTRACT

A low voltage differential signaling driver includes at least one output circuit, a first control circuit, and a second control circuit. The output circuit includes a first input terminal to receive a first input signal, a second input terminal to receive a second input signal, a first output terminal to output a first output signal, a second output terminal to output a second output signal, and first to sixth transistors. The first control circuit controls a voltage of a control terminal of the first transistor to make a voltage of the first output signal equal to a first reference voltage when the first input signal has a first value. The second control circuit controls a voltage of a control terminal of the second transistor to make the voltage of the first output signal equal to a second reference voltage when the first input signal has a second value.

9 Claims, 11 Drawing Sheets

(52) U.S. Cl.
CPC ..... *H03K 19/018528* (2013.01); *H03L 7/081* (2013.01); *H03L 7/093* (2013.01); *H04L 25/0272* (2013.01)

(58) Field of Classification Search
USPC .......................................... 327/65, 306, 333
See application file for complete search history.

(56) References Cited

U.S. PATENT DOCUMENTS

| | | | | |
|---|---|---|---|---|
| 6,873,660 | B2* | 3/2005 | Bu | ........................ H04L 25/028 326/21 |
| 7,012,450 | B1* | 3/2006 | Oner | ................... H04L 25/0276 326/86 |
| 7,898,295 | B1* | 3/2011 | Kasturirangan | ..... H03K 17/165 326/30 |
| 2014/0002151 | A1 | 1/2014 | Watabe et al. | |

FOREIGN PATENT DOCUMENTS

| | | |
|---|---|---|
| JP | 2005-223872 | 8/2005 |
| JP | 2007-208705 | 8/2007 |
| JP | 2008-236064 | 10/2008 |
| JP | 2011-188323 | 9/2011 |
| JP | 2015-122644 | 7/2015 |
| JP | 2017-112458 | 6/2017 |

* cited by examiner

LOW VOLTAGE DIFFERENTIAL SIGNALING DRIVER

CROSS-REFERENCE TO RELATED APPLICATIONS

This patent application is based on and claims priority pursuant to 35 U.S.C. § 119(a) to Japanese Patent Application No. 2016-223706 filed on Nov. 17, 2016, in the Japan Patent Office, and Japanese Patent Application No. 2017-124068 filed on Jun. 26, 2017, in the Japan Patent Office, the entire disclosure of which is hereby incorporated by reference herein.

BACKGROUND

Technical Field

The present invention relates to a low voltage differential signaling driver.

Description of the Related Art

A low voltage differential signaling (LVDS) system has been used as a data communication system. The LVDS system transmits digital data from an LVDS driver to an LVDS receiver in the form of low voltage differential signals, thereby achieving high-speed data communication with low electromagnetic interference (EMI).

In the past, a voltage output LVDS driver has been proposed in which a reference voltage generated by a resistor provided as a replica of a terminating resistor is applied to a gate terminal of a source follower. This LVDS driver stabilizes a common-mode voltage of an output signal.

In the existing LVDS driver, however, manufacturing variations of the resistor provided as the replica of the terminating resistor causes variations of the output amplitude.

SUMMARY

In one embodiment of this invention, there is provided an improved low voltage differential signaling driver that includes, for example, at least one output circuit, a first control circuit, and a second control circuit. The at least one output circuit includes a first input terminal to receive an input of a first input signal, a second input terminal to receive an input of a second input signal, a first output terminal to output a first output signal, a second output terminal to output a second output signal, and first to sixth transistors. The first transistor has a first terminal connected to a high-voltage power supply, a second terminal connected to a first node, and a control terminal. The second transistor has a first terminal connected to a low-voltage power supply, a second terminal connected to a second node, and a control terminal. The third transistor has a first terminal connected to the first node, a second terminal connected to the first output terminal, and a control terminal connected to the first input terminal of the at least one output circuit. The fourth transistor has a first terminal connected to the first node, a second terminal connected to the second output terminal, and a control terminal connected to the second input terminal of the at least one output circuit. The fifth transistor has a first terminal connected to the first output terminal, a second terminal connected to the second node, and a control terminal connected to the second input terminal of the at least one output circuit. The sixth transistor has a first terminal connected to the second output terminal, a second terminal connected to the second node, and a control terminal connected to the first input terminal of the at least one output circuit. The first control circuit controls a voltage of the control terminal of the first transistor to make a voltage of the first output signal equal to a first reference voltage when the first input signal has a first value. The second control circuit controls a voltage of the control terminal of the second transistor to make the voltage of the first output signal equal to a second reference voltage when the first input signal has a second value.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein.

Figure 1:
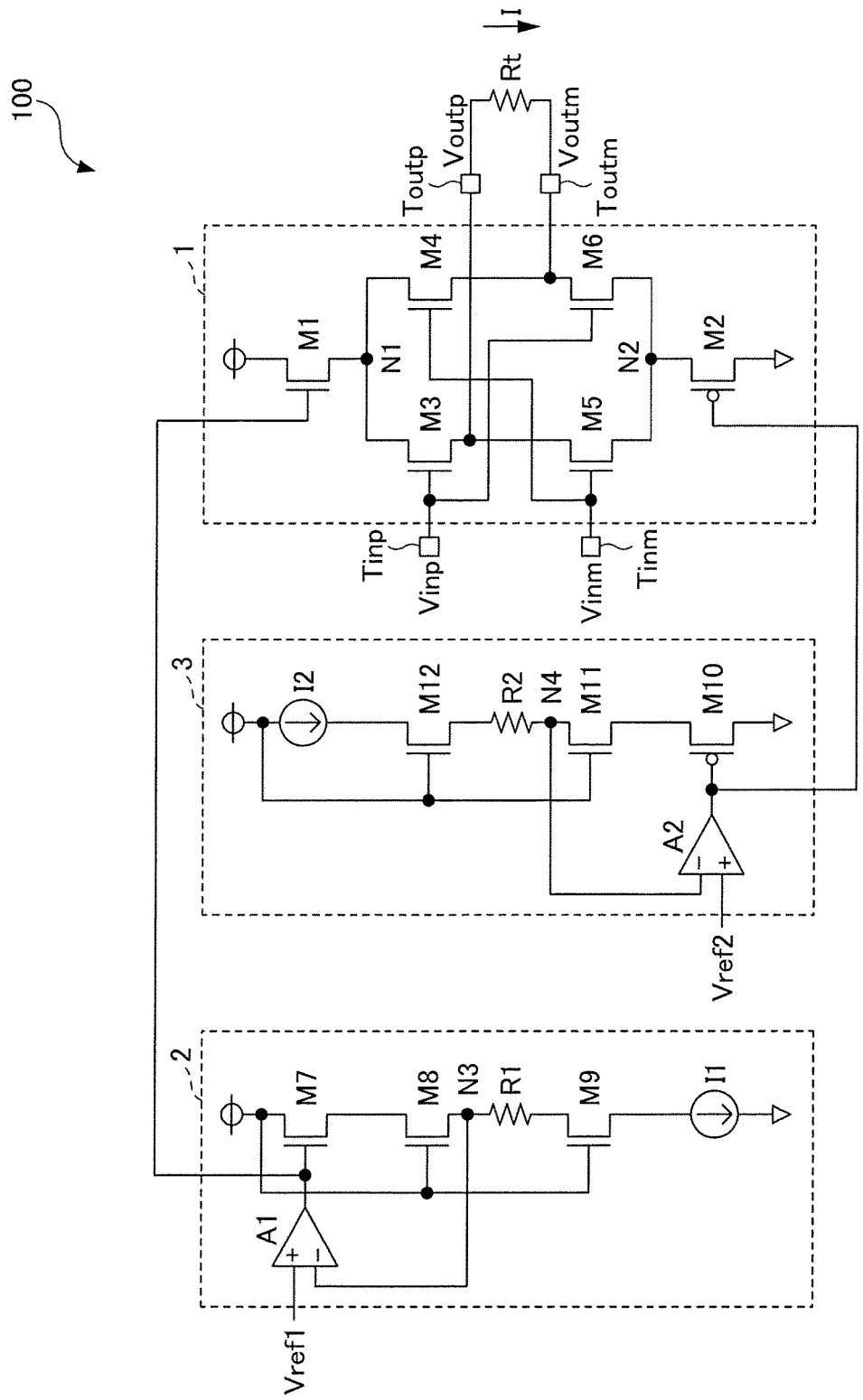
FIG. 1 is a diagram illustrating an example of a low voltage differential signaling (LVDS) driver according to a first embodiment of the present invention.

The accompanying drawings are intended to depict embodiments of the present invention and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Referring now to the accompanying drawings, wherein like reference numerals designate identical or corresponding parts throughout the several views, embodiments of the present invention will be described. Redundant description of such parts having the substantially same functional configuration will be omitted.

A first embodiment of the present invention will be described. A low voltage differential signaling (LVDS) driver 100 according to the first embodiment will be described with reference to FIGS. 1 to 5.

FIG. 1 is a diagram illustrating an example of the LVDS driver 100 according to the first embodiment. The LVDS driver 100 in FIG. 1 includes an output circuit 1, a first control circuit 2, and a second control circuit 3.

The output circuit 1 receives inputs of digital differential signals, converts the input signals into low-voltage digital signals, and outputs the converted signals as differential signals. The output circuit 1 includes input terminals Tinp and Tinm, output terminals Toutp and Toutm, and transistors M1, M2, M3, M4, M5, and M6.

The input terminal Tinp (i.e., a first input terminal) receives an input of an input signal Vinp (i.e., a first input signal), which is a digital signal having a high (H) value or a low (L) value.

The input terminal Tinm (i.e., a second input terminal) receives an input of an input signal Vinm (i.e., a second input signal), which is a digital signal having the H value or the L value.

The input signals Vinp and Vinm are differential signals input to the input terminals Tinp and Tinm, respectively. With the H value, the voltage of each of the input signals Vinp and Vinm serves as a power supply voltage. With the L value, the voltage of each of the input signals Vinp and Vinm serves as a ground voltage.

The output terminal Toutp (i.e. a first output terminal) outputs an output signal Voutp (i.e., a first output signal), which is a digital signal having the H value or the L value.

The output terminal Toutm (i.e. a second output terminal) outputs an output signal Voutm (i.e., a second output signal), which is a digital signal having the H value or the L value.

The output signals Voutp and Voutm are differential signals output from the output terminals Toutp and Toutm, respectively. The output signal Voutm corresponds to the output signal Voutp reversed at a common-mode voltage Vcom in FIG. 2. Hereinafter, the voltage of each of the output signals Voutp and Voutm with the H value (i.e., a first value) will be referred to as the high-level voltage VH, and the voltage of each of the output signals Voutp and Voutm with the L value (i.e., a second value) will be referred to as the low-level voltage VL.

Figure 2:
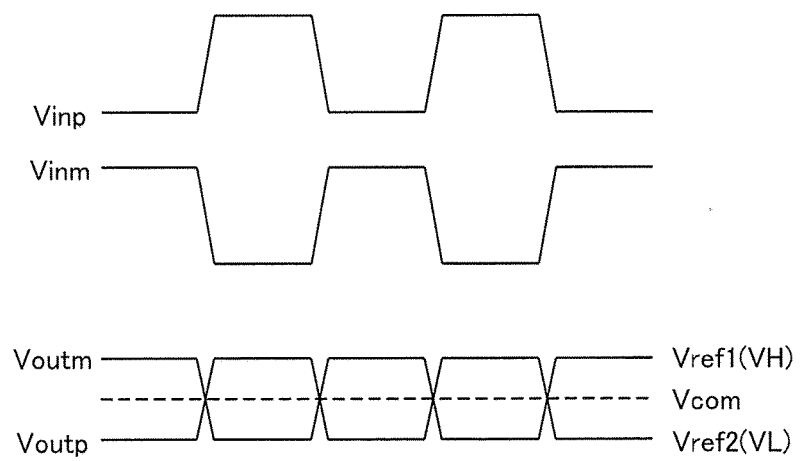
FIG. 2 is a chart illustrating an example of input signals and output signals of the LVDS driver.

FIG. 2 is a chart illustrating an example of the input signals Vinp and Vinm and the output signals Voutp and Voutm. As illustrated in FIG. 2, the input signal Vinm has the L value when the input signal Vinp has the H value, and the input signal Vinm has the H value when the input signal Vinp has the L value. Similarly, the output signal Voutm has the L value when the output signal Voutp has the H value, and the output signal Voutm has the H value when the output signal Voutp has the L value.

Further, the output signal Voutp and the input signal Vinp have the same phase, and the output signal Voutm and the input signal Vinm have the same phase. That is, the output signal Voutp has the H value when the input signal Vinp has the H value, and the output signal Voutp has the L value when the input signal Vinp has the L value. Similarly, the output signal Voutm has the H value when the input signal Vinm has the H value, and the output signal Voutm has the L value when the input signal Vinm has the L value.

In the first embodiment, the high-level voltage VH is set to be lower than the power supply voltage, and the low-level voltage VL is set to be higher than the ground voltage. As illustrated in FIG. 2, therefore, the amplitude of the output signals Voutp and Voutm is smaller than the amplitude of the input signals Vinp and Vinm. The amplitude of the output signals Voutp and Voutm is 0.35 V, for example, but is not limited thereto.

As illustrate in FIG. 1, a terminating resistor Rt is connected between the output terminals Toutp and Toutm. The terminating resistor Rt is provided outside the LVDS driver 100, and a current I flows through the terminating resistor Rt. When the input signal Vinp and the input signal Vinm have the H value and the L value, respectively, or have the L value and the H value, respectively, a current value i of the current I is represented as i=(VH−VL)/rt wherein rt represents the resistance value of the terminating resistor Rt. The direction of the current I will be described later.

The transistor M1 (i.e., a first transistor) is an N-channel metal-oxide-semiconductor field-effect transistor (MOSFET), which will hereinafter be referred to as NMOS. The transistor M1 has a drain terminal (i.e., a first terminal) connected to a power supply (i.e., a high-voltage power supply), a source terminal (i.e., a second terminal) connected to a node N1 (i.e., a first node), and a gate terminal (i.e., a control terminal) connected to a later-described output terminal of the first control circuit 2. The transistor M1 functions as a source follower.

The transistor M2 (i.e., a second transistor) is a P-channel MOSFET, which will hereinafter be referred to as PMOS. The transistor M2 has a drain terminal (i.e., a first terminal) connected to a ground (i.e., a low-voltage power supply, which outputs a voltage lower than that of the high-voltage power supply), a source terminal (i.e., a second terminal) connected to a node N2 (i.e., a second node), and a gate terminal (i.e., a control terminal) connected to a later-described output terminal of the second control circuit 3. The transistor M2 functions as a source follower.

The transistor M3 (i.e., a third transistor) is an NMOS having a drain terminal (i.e., a first terminal) connected to the node N1, a source terminal (i.e., a second terminal) connected to the output terminal Toutp, and a gate terminal (i.e., a control terminal) connected to the input terminal Tinp.

The transistor M4 (i.e., a fourth transistor) is an NMOS having a drain terminal (i.e., a first terminal) connected to the node N1, a source terminal (i.e., a second terminal) connected to the output terminal Toutm, and a gate terminal (i.e., a control terminal) connected to the input terminal Tinm. The transistors M4 and M3 have the same device size.

The transistor M5 (i.e., a fifth transistor) is an NMOS having a drain terminal (i.e., a first terminal) connected to the output terminal Toutp, a source terminal (i.e., a second terminal) connected to the node N2, and a gate terminal (i.e., a control terminal) connected to the input terminal Tinm.

The transistor M6 (i.e., a sixth transistor) is an NMOS having a drain terminal (i.e., a first terminal) connected to the output terminal Toutm, a source terminal (i.e., a second terminal) connected to the node N2, and a gate terminal (i.e., a control terminal) connected to the input terminal Tinp. The transistors M6 and M5 have the same device size.

The transistors M3 to M6 form a switch circuit, and each function as a switch. Specifically, if the input signal Vinp has the H value (i.e., the input signal Vinm has the L value), the transistors M3 and M6 are turned on, and the transistors M4 and M5 are turned off. In this case, the current I flows from the output terminal Toutp to the output terminal Toutm, as indicated by an arrow in FIG. 1. If the input signal Vinp has the L value (i.e., the input signal Vinm has the H value), the transistors M3 and M6 are turned off, and the transistors M4 and M5 are turned on. In this case, the current I flows from the output terminal Toutm to the output terminal Toutp.

The first control circuit 2 controls a gate voltage of the transistor M1 to make the high-level voltage VH equal to a reference voltage Vref1 (i.e., a first reference voltage), i.e., VH=Vref1. The first control circuit 2 corresponds to a replica of the output circuit 1. The first control circuit 2 includes transistors M7, M8, and M9, a resistor R1, an operational amplifier A1, and a current source I1.

The transistor M7 (i.e., a seventh transistor) is an NMOS having a drain terminal (i.e., a first terminal) connected to the high-voltage power supply, a source terminal (i.e., a second terminal) connected to a drain terminal of the transistor M8, and a gate terminal (i.e., a control terminal) connected to the gate terminal of the transistor M1. The gate terminal of the transistor M7 corresponds to an output terminal of the first control circuit 2. The transistor M7 functions as a replica of the transistor M1. The device size of the transistor M7 is 1/n times that of the transistor M1.

The transistor M8 (i.e., an eighth transistor) is an NMOS having a drain terminal (i.e., a first terminal) connected to the source terminal of the transistor M7, a source terminal (i.e., a second terminal) connected to a node N3 (i.e., a third node), and a gate terminal (i.e., a control terminal) connected to the high-voltage power supply. The transistor M8 functions as a replica of the transistors M3 and M4. The device size of the transistor M8 is 1/n times that of the transistors M3 and M4.

The transistor M9 (i.e., a ninth transistor) is an NMOS having a drain terminal (i.e., a first terminal) connected to one end of the resistor R1, a source terminal (i.e., a second terminal) connected to a high-voltage side of the current source I1, and a gate terminal (i.e., a control terminal) connected to the high-voltage power supply. The transistor M9 functions as a replica of the transistors M5 and M6. The device size of the transistor M9 is 1/n times that of the transistors M5 and M6.

The resistor R1 (i.e., a first resistor) has one end connected to the drain terminal of the transistor M9 and the other end connected to the node N3. The resistor R1 functions as a replica of the terminating resistor Rt. A resistance value r1 of the resistor R1 is n times the resistance value rt of the terminating resistor Rt, i.e., r1=n×rt.

The operational amplifier A1 (i.e., a first operational amplifier) has a non-inversion input terminal (i.e., a first input terminal) that is applied with the reference voltage Vref1, an inversion input terminal (i.e., a second input terminal) connected to the node N3, and an output terminal connected to the gate terminal of the transistor M1. The output terminal of the operational amplifier A1 corresponds to an output terminal of the first control circuit 2.

The current source I1 (i.e., a first current source) is a constant current source having a high-voltage side connected to the source terminal of the transistor M9 and a low-voltage side connected to the ground. The current source T1 is formed of a current mirror circuit, for example, to supply a current (i.e., a first current) from the current source I1 to the transistors M7 to M9, the resistor R1, and the node N3. The current source I1 functions as a replica of the transistor M2. A current value i1 of the current supplied from the current source I1 is 1/n times the current value i of the current I flowing through the terminating resistor Rt when the input signal Vinp and the input signal Vinm have the H value and the L value, respectively, or have the L value and the H value, respectively (i.e., i1=i/n wherein i=(VH−VL)/rt).

The second control circuit 3 controls a gate voltage of the transistor M2 to make the low-level voltage VL equal to a reference voltage Vref2 (i.e., a second reference voltage), i.e., VL=Vref2. The second control circuit 3 corresponds to a replica of the output circuit 1. The second control circuit 3 includes transistors M10, M11, and M12, a resistor R2, an operational amplifier A2, and a current source I2.

The transistor M10 (i.e., a tenth transistor) is a PMOS having a drain terminal (i.e., a first terminal) connected to the ground, a source terminal (i.e., a second terminal) connected to a source terminal of the transistor M11, and a gate terminal (i.e., a control terminal) connected to the gate terminal of the transistor M2. The gate terminal of the transistor M10 corresponds to an output terminal of the second control circuit 3. The transistor M10 functions as a replica of the transistor M2. The device size of the transistor M10 is 1/n times that of the transistor M2.

The transistor M11 (i.e., an eleventh transistor) is an NMOS having a drain terminal (i.e., a first terminal) connected to a node N4 (i.e., a fourth node), a source terminal (i.e., a second terminal) connected to the source terminal of the transistor M10, and a gate terminal (i.e., a control terminal) connected to the high-voltage power supply. The transistor M11 functions as a replica of the transistors M5 and M6. The device size of the transistor M11 is 1/n times that of the transistors M5 and M6.

The transistor M12 (i.e., a twelfth transistor) is an NMOS having a drain terminal (i.e., a first terminal) connected to a low-voltage side of the current source I2, a source terminal (i.e., a second terminal) connected to one end of the resistor R2, and a gate terminal (i.e., a control terminal) connected to the high-voltage power supply. The transistor M12 functions as a replica of the transistors M3 and M4. The device size of the transistor M12 is 1/n times that of the transistors M3 and M4.

The resistor R2 (i.e., a second resistor) has one end connected to the source terminal of the transistor M12 and the other end connected to the node N4. The resistor R2 functions as a replica of the terminating resistor Rt. A resistance value r2 of the resistor R2 is n times the resistance value rt of the terminating resistor Rt, i.e., r2=n×rt. Therefore, the resistance value r1 of the resistor R1 and the resistance value r2 of the resistor R2 are equal, i.e., r1=r2.

The operational amplifier A2 (i.e., a second operational amplifier) has a non-inversion input terminal (i.e., a first input terminal) that is applied with the reference voltage Vref2, an inversion input terminal (i.e., a second input terminal) connected to the node N4, and an output terminal connected to the gate terminal of the transistor M2. The output terminal of the operational amplifier A2 corresponds to an output terminal of the second control circuit 3.

The current source I2 (i.e., a second current source) is a constant current source having a high-voltage side connected to the high-voltage power supply and a low-voltage side connected to the drain terminal of the transistor M12. The current source I2 is formed of a current mirror circuit, for example, to supply a current (i.e., a second current) from the current source I2 to the transistors M10 to M12, the resistor R2, and the node N4. The current source I2 functions as a replica of the transistor M1. A current value i2 of the current supplied from the current source I2 is 1/n times the current value i of the current I flowing through the terminating resistor Rt when the input signal Vinp has the H value or the L value, i.e., i2=i/n wherein i=(VH−VL)/rt. Therefore, the current value i1 of the current from the current source I1 and the current value i2 of the current from the current source I2 are equal, i.e., i1=i2.

Operations of the first control circuit 2 and the second control circuit 3 will now be described.

In the operation of the first control circuit 2, the operational amplifier A1 of the first control circuit 2 controls a gate voltage of the transistor M7 to make the voltage of the inversion input terminal of the operational amplifier A1 equal to the reference voltage Vref1 of the non-inversion input terminal of the operational amplifier A1. Since the inversion input terminal of the operational amplifier A1 is connected to the node N3, the voltage of the node N3 is controlled by the operational amplifier A1 to be equal to the reference voltage Vref1. Further, since the first control circuit 2 is a replica of the output circuit 1, the voltage of a part of the output circuit 1 corresponding to the node N3 is also controlled by the operational amplifier A1 to be equal to the reference voltage Vref1.

Specifically, if the input signal Vinp has the H value (i.e., the input signal Vinm has the L value), the first control circuit 2 forms a replica of a circuit including the transistors M1, M2, M3, and M6 and the terminating resistor Rt. In this case, the part of the output circuit 1 corresponding to the node N3 is the output terminal Toutp. If the input signal Vinp has the H value (i.e., the input signal Vinm has the L value), therefore, the voltage of the output signal Voutp (i.e., the high-level voltage VH) is controlled by the first control circuit 2 to be equal to the reference voltage Vref1.

If the input signal Vinp has the L value (i.e., the input signal Vinm has the H value), the first control circuit 2 forms a replica of a circuit including the transistors M1, M2, M4, and M5 and the terminating resistor Rt. In this case, the part of the output circuit 1 corresponding to the node N3 is the output terminal Toutm. If the input signal Vinp has the L value (i.e., the input signal Vinm has the H value), therefore, the voltage of the output signal Voutm (i.e., the high-level voltage VH) is controlled by the first control circuit 2 to be equal to the reference voltage Vref1.

The first control circuit 2 thus controls the gate voltage of the transistor M1 to make the high-level voltage VH equal to the reference voltage Vref1. With the setting of the reference voltage Vref1, therefore, the high-level voltage VH of the output signals Voutp and Voutm is set to a desired value.

In the operation of the second control circuit 3, the operational amplifier A2 of the second control circuit 3 controls a gate voltage of the transistor M10 to make the voltage of the inversion input terminal of the second control circuit 3 equal to the reference voltage Vref2 of the non-inversion input terminal of the second control circuit 3. Since the inversion input terminal of the second control circuit 3 is connected to the node N4, the voltage of the node N4 is controlled by the operational amplifier A2 to be equal to the reference voltage Vref2. Further, since the second control circuit 3 is a replica of the output circuit 1, the voltage of a part of the output circuit 1 corresponding to the node N4 is also controlled by the operational amplifier A2 to be equal to the reference voltage Vref2.

Specifically, if the input signal Vinp has the H value (i.e., the input signal Vinm has the L value), the second control circuit 3 forms a replica of a circuit including the transistors M1, M2, M3, and M6 and the terminating resistor Rt. In this case, the part of the output circuit 1 corresponding to the node N4 is the output terminal Toutm. If the input signal Vinp has the H value (i.e., the input signal Vinm has the L value), therefore, the voltage of the output signal Voutm (i.e., the low-level voltage VL) is controlled by the second control circuit 3 to be equal to the reference voltage Vref2.

If the input signal Vinp has the L value (i.e., the input signal Vinm has the H value), the second control circuit 3 forms a replica of a circuit including the transistors M1, M2, M4, and M5 and the terminating resistor Rt. In this case, the part of the output circuit 1 corresponding to the node N4 is the output terminal Toutp. If the input signal Vinp has the L value (i.e., the input signal Vinm has the H value), therefore, the voltage of the output signal Voutp (i.e., the low-level voltage VL) is controlled by the second control circuit 3 to be equal to the reference voltage Vref2.

The second control circuit 3 thus controls the gate voltage of the transistor M2 to make the low-level voltage VL equal to the reference voltage Vref2. With the setting of the reference voltage Vref2, therefore, the low-level voltage VL of the output signals Voutp and Voutm is set to a desired value.

In the first embodiment, the common-mode voltage Vcom is represented as Vcom=(Vref1+Vref2)/2. The common-mode voltage Vcom is therefore set based on the setting of the reference voltages Vref1 and Vref2. For example, to set the common-mode voltage Vcom to 1.25 V for a differential output signal (i.e., Voutp−Voutm) of 0.35 V, the reference voltages Vref1 and Vref2 may be set to 1.425 V and 1.075 V, respectively.

Manufacturing variations of the resistors R1 and R2 may cause errors in design resistance values of the resistors R1 and R2.

For example, if the actual resistance value r1 of the resistor R1 is greater than the design resistance value n×rt of the resistor R1 by 25%, the resistance value r1 of the resistor R1 is represented as r1=n×rt×1.25. In this case, the voltage of the node N3 is controlled by the operational amplifier A1 to be equal to the reference voltage Vref1. Thus, a drain voltage value vd of a drain voltage Vd of the transistor M9 (i.e., the voltage at the one end of the resistor R1) is represented as vd=Vref1−i1×r1=Vref1−(i/n)×(n×rt×1.25)=Vref1−1.25×i×rt. In this case, the drain voltage value vd of the drain voltage Vd is lower by 0.25×i×rt than that in a case in which the actual resistance value r1 of the resistor R1 is equal to the design resistance value n×rt of the resistor R1. The reduction in the drain voltage value vd leads to a reduction in a source voltage value vs of a source voltage Vs of the transistor M9. If the current source I1 is configured to be capable of supplying the current irrespective of the reduction in the source voltage value vs, the voltage of the node N3 is controlled to be equal to the reference voltage Vref1 irrespective of the reduction in the source voltage value vs. Accordingly, the high-level voltage VH is controlled to be equal to the reference voltage Vref1.

If the actual resistance value r1 of the resistor R1 is less than the design resistance value n×rt of the resistor R1 by 25%, the resistance value r1 of the resistor R1 is represented as r1=n×rt×0.75, and the drain voltage value vd of the drain voltage Vd is represented as vd=Vref1−i1×r1=Vref1−(i/n)×(n×rt×0.75)=Vref1−0.75×i×rt. In this case, the drain voltage value vd is higher by 0.25×i×rt than that in the case in which the actual resistance value r1 of the resistor R1 is equal to the design resistance value n×rt of the resistor R1. The increase in the drain voltage value vd leads to an increase in the source voltage value vs of the source voltage Vs of the transistor M9. If the current source I1 is configured to be capable of supplying the current irrespective of the increase in the source voltage value vs, the voltage of the node N3 is controlled to be equal to the reference voltage Vref1 irrespective of the increase in the source voltage value vs. Accordingly, the high-level voltage VH is controlled to be equal to the reference voltage Vref1.

As described above, even if the manufacturing variations of the resistor R1 cause the error in the design resistance value n×rt of the resistor R1, the first control circuit 2 is capable of controlling the high-level voltage VH to be equal to the reference voltage Vref1. The current source I1 may employ a current mirror circuit formed of a transistor operable in a saturation region even if the manufacturing variations of the resistor R1 cause an error in the source voltage value vs.

The same applies to the second control circuit 3. That is, even if the manufacturing variations of the resistor R2 cause the error in the design resistance value n×rt of the resistor R2, the second control circuit 3 is capable of controlling the low-level voltage VL to be equal to the reference voltage Vref2. The current source I2 may employ a current mirror circuit formed of a transistor operable in a saturation region even if the manufacturing variations of the resistor R2 cause an error in the drain voltage value vd of the drain voltage Vd of the transistor M12.

As described above, according to the first embodiment, the high-level voltage VH is controlled to be equal to the reference voltage Vref1 even if the manufacturing variations of the resistor R1 cause the error in the design resistance value n×rt of the resistor R1. Further, the low-level voltage VL is controlled to be equal to the reference voltage Vref2 even if the manufacturing variations of the resistor R2 cause the error in the design resistance value n×rt of the resistor R2. Consequently, the first embodiment reduces the influence of the manufacturing variations of the resistors R1 and R2, thereby reducing variations of the output amplitude.

In the first embodiment, if the current source I1 is capable of stably supplying the current (i.e., operable in the saturation region), at least one of the transistor M9 and the resistor R1 may be removed from the first control circuit 2. Similarly, if the current source I2 is capable of stably supplying the current (i.e., operable in the saturation region), at least one of the transistor M12 and the resistor R2 may be removed from the second control circuit 3.

Figure 3:
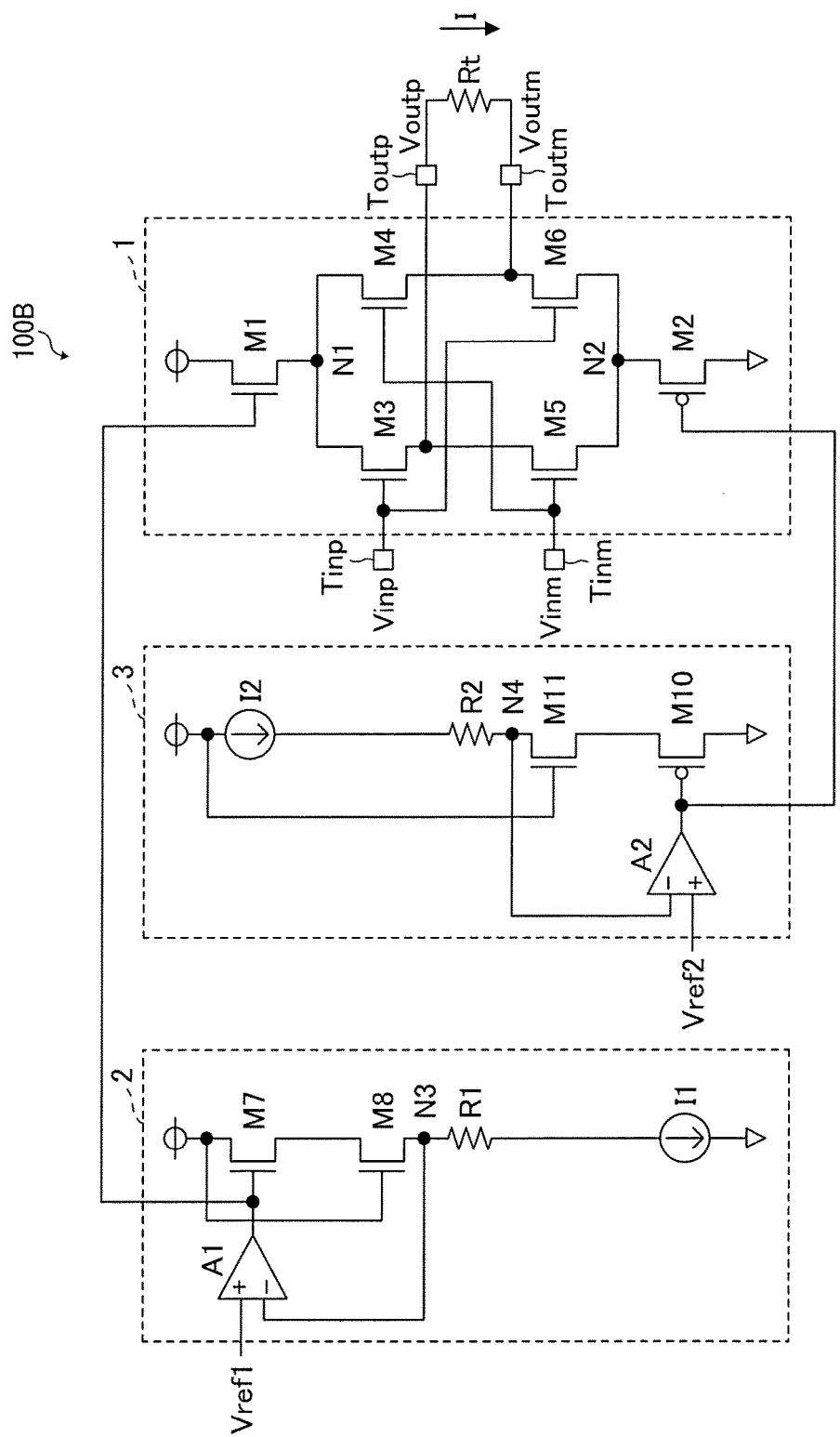
FIGS. 3 to 5 are diagrams illustrating modified examples of the LVDS driver according to the first embodiment.
Figure 4:
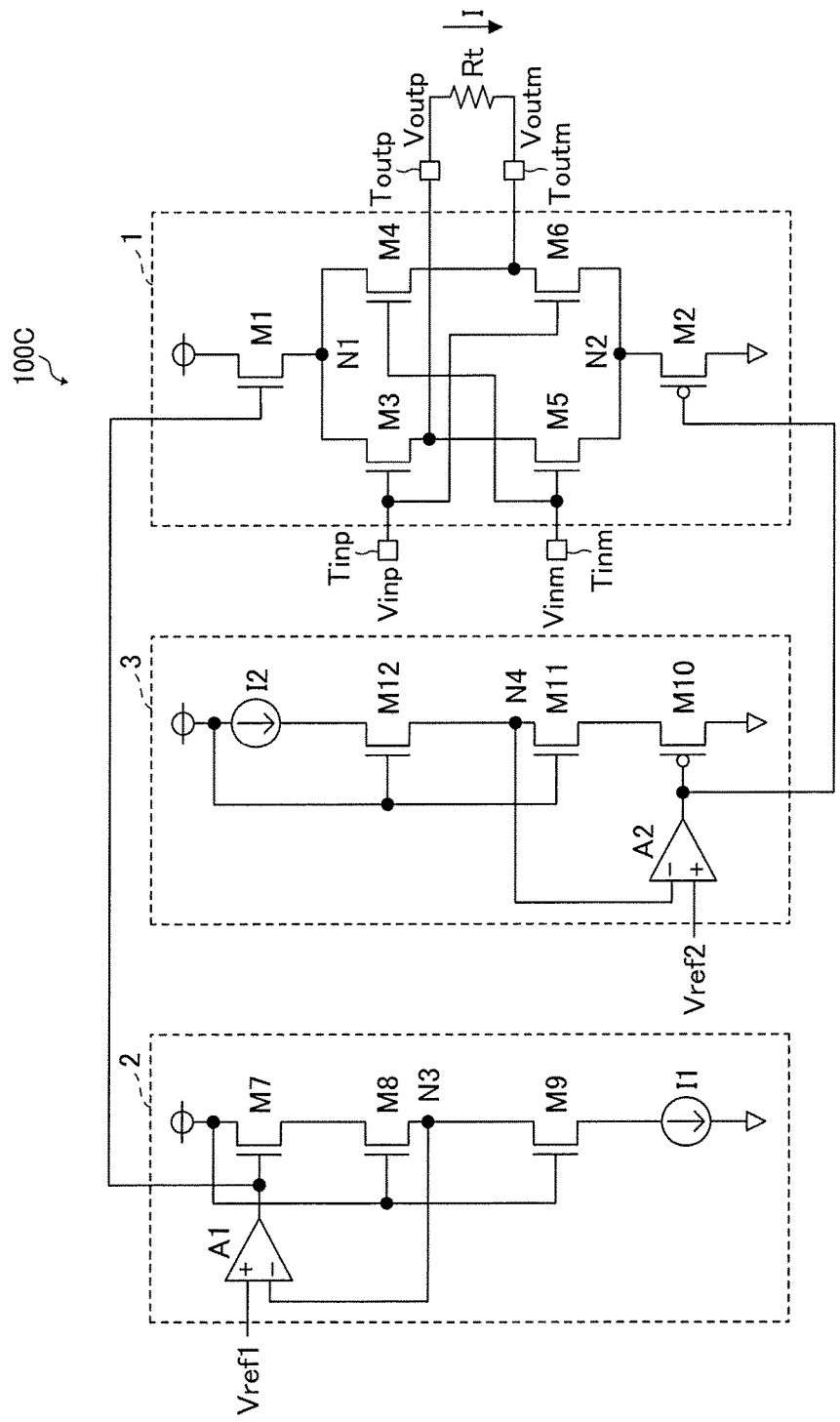
Figure 5:
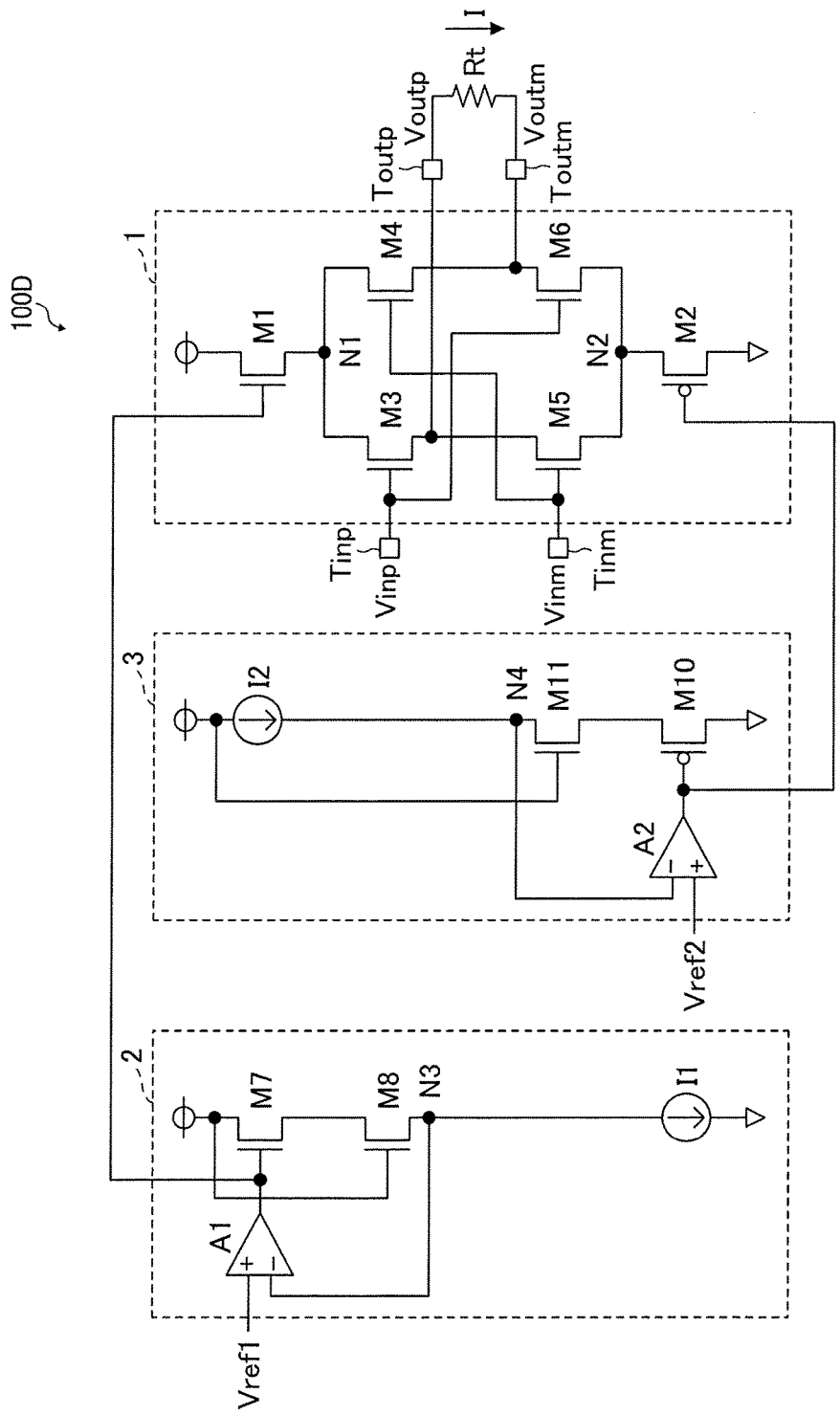

FIGS. 3 to 5 are diagrams illustrating LVDS drivers 100B, 100C, and 100D as modified examples of the LVDS driver 100 according to the first embodiment.

In the example in FIG. 3, the first control circuit 2 does not include the transistor M9, and the second control circuit 3 does not include the transistor M12. The one end of the resistor R1 is connected to the high-voltage side of the current source I1, and the one end of the resistor R2 is connected to the low-voltage side of the current source I2.

In the example in FIG. 4, the first control circuit 2 does not include the resistor R1, and the second control circuit 3 does not include the resistor R2. The drain terminal of the transistor M9 is connected to the node N3, and the source terminal of the transistor M12 is connected to the node N4.

In the example in FIG. 5, the first control circuit 2 does not include the transistor M9 and the resistor R1, and the second control circuit 3 does not include the transistor M12 and the resistor R2. The node N3 is connected to the high-voltage side of the current source I1, and the node N4 is connected to the low-voltage side of the current source I2.

If the current sources I1 and I2 are operable in the saturation region, the configurations in FIGS. 3 to 5 are capable of controlling the high-level voltage VH and the low-level voltage VL to be equal to the reference voltage Vref1 and the reference voltage Vref2, respectively. Consequently, these configurations reduce the influence of the manufacturing variations of the resistors R1 and R2, thereby reducing the variations of the output amplitude.

The foregoing description has been given of an example in which the transistors M1 to M12 are MOSFETs. Alternatively, the transistors M1 to M12 may be bipolar transistors. In this case, the NMOS, the PMOS, the drain terminal, the source terminal, and the gate terminal in the above description may be read as an NPN transistor, a PNP transistor, a collector terminal, an emitter terminal, and a base terminal, respectively.

A second embodiment of the present invention will now be described. An LVDS driver 101 according to the second embodiment will be described with reference to FIG. 6.

Figure 6:
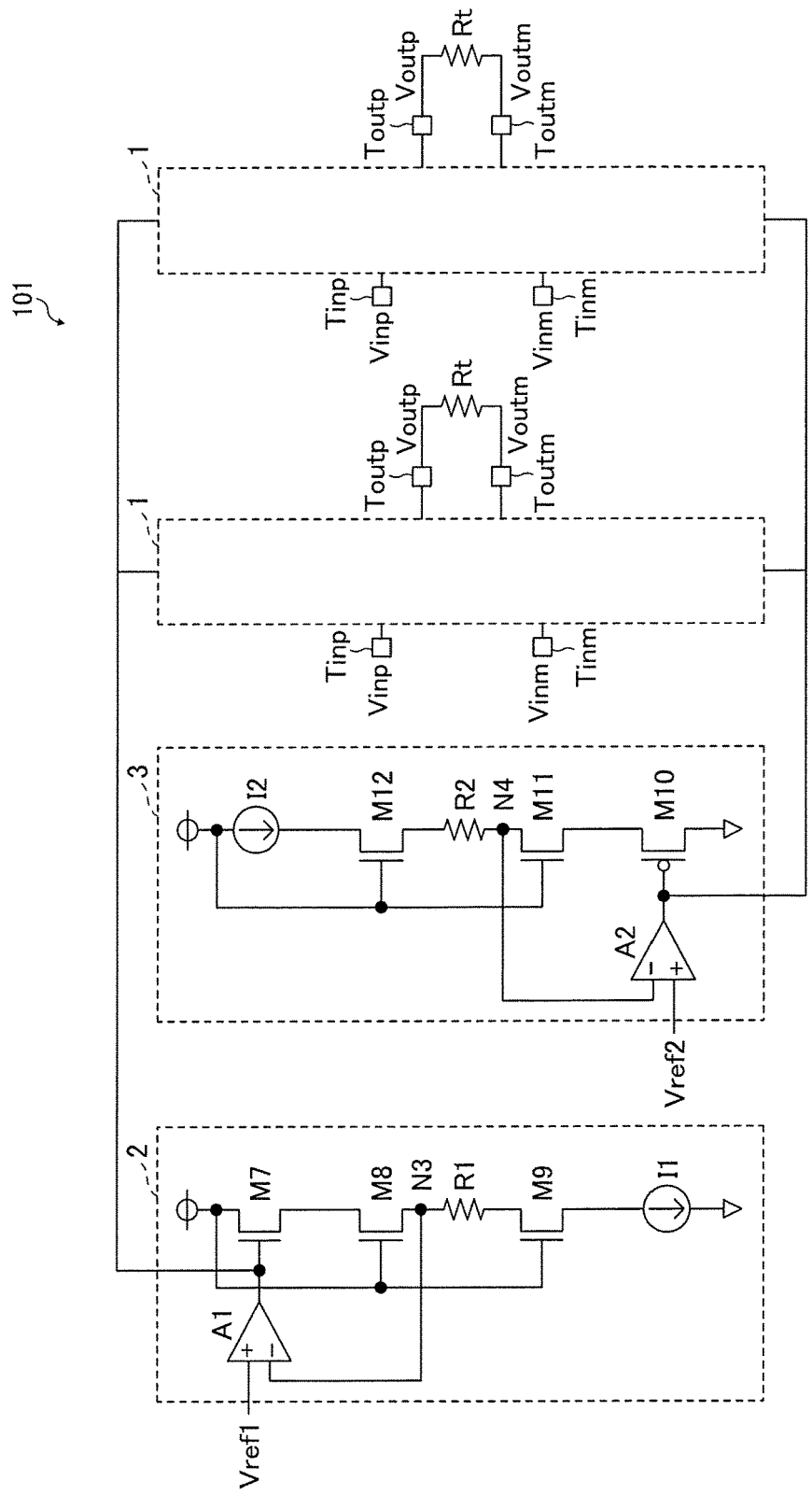
FIG. 6 is a diagram illustrating an example of an LVDS driver according to a second embodiment of the present invention.

FIG. 6 is a diagram illustrating an example of the LVDS driver 101 according to the second embodiment. The LVDS driver 101 according to the second embodiment includes a plurality of output circuits 1. The LVDS driver 101 includes two output circuits 1 in the example of FIG. 6, but may include three or more output circuits 1. The example of FIG. 6 is similar to the example of FIG. 1 in the configuration of each of the output circuits 1 and other components.

According to the second embodiment, the first control circuit 2 controls the high-level voltage VH to be equal to the reference voltage Vref1 in each of the output circuits 1, and the second control circuit 3 controls the low-level voltage VL to be equal to the reference voltage Vref2 in each of the output circuits 1. Consequently, the second embodiment reduces the influence of the manufacturing variations of the resistors R1 and R2, thereby reducing the variations of the output amplitude.

Further, according to the second embodiment, there is no need to increase the number of the first control circuit 2 and the second control circuit 3 with the increase in the number of the output circuits 1. This prevents an increase in the circuit area and the power consumption of the LVDS driver 101.

A third embodiment of the present invention will now be described. An LVDS driver 102 according to the third embodiment will be described with reference to FIGS. 7 to 11.

Figure 7:
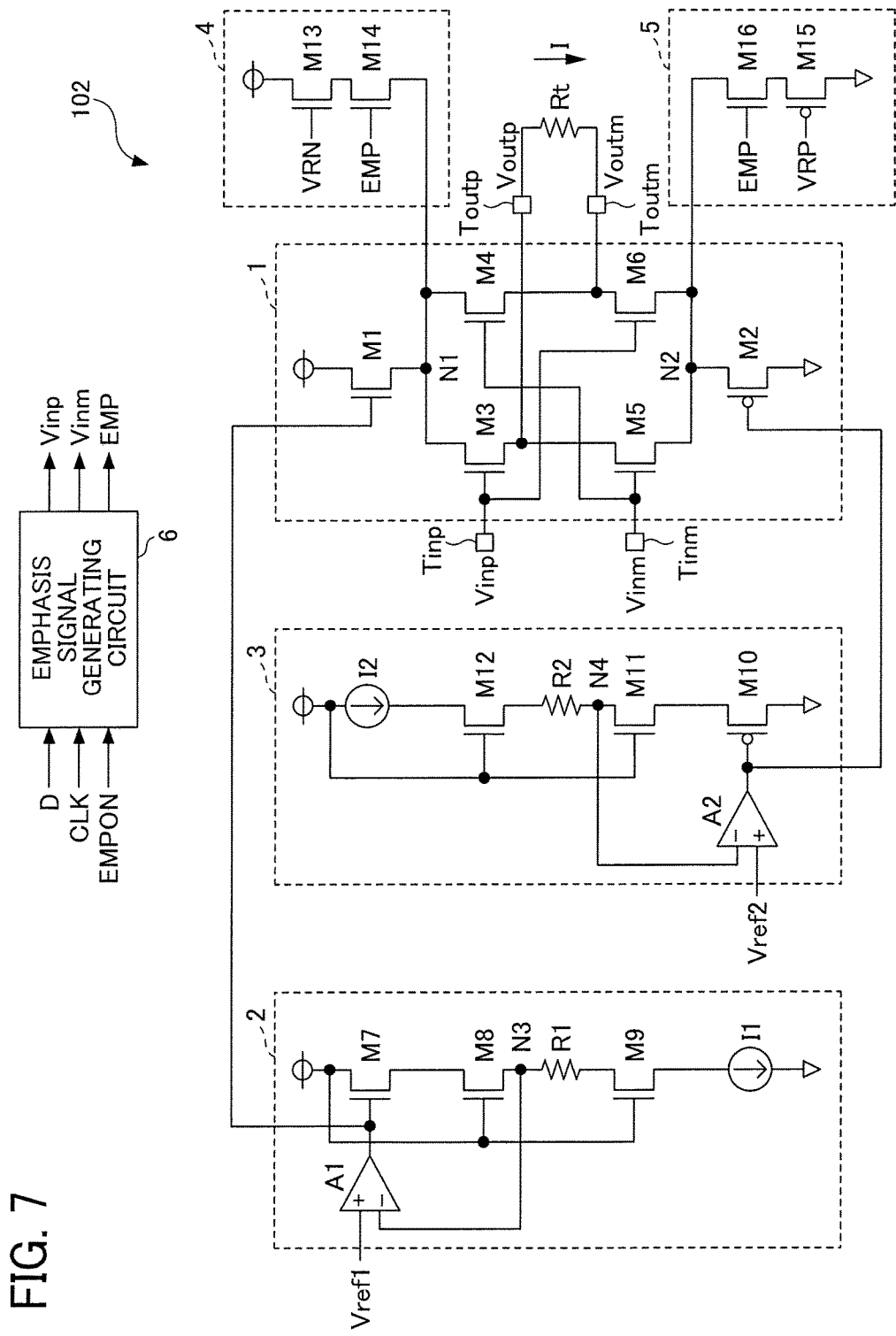
FIG. 7 is a diagram illustrating an example of an LVDS driver according to a third embodiment of the present invention.

FIG. 7 is a diagram illustrating an example of the LVDS driver 102 according to the third embodiment. The LVDS driver 102 in FIG. 7 includes amplitude amplifying circuits 4 and 5 and an emphasis signal generating circuit 6. The example of FIG. 7 is similar to the example of FIG. 1 in the configuration of other components.

The amplitude amplifying circuit 4 (i.e., a first amplitude amplifying circuit) amplifies the amplitudes of the output signals Voutp and Voutm in accordance with an emphasis signal EMP. Specifically, the amplitude amplifying circuit 4 controls the voltage of the node N1 to make at least a part of the high-level voltage VH equal to a reference voltage Vref3 (i.e., a third reference voltage), i.e., VH=Vref3. The reference voltage Vref3 is higher than the reference voltage Vref1.

The emphasis signal EMP is a digital signal having the H value or the L value. If the emphasis signal EMP has the H value, the amplitude amplifying circuit 4 increases the voltage of the node N1 to increase the high-level voltage VH to the reference voltage Vref3. Thereby, the amplitudes of the output signals Voutp and Voutm are increased. If the emphasis signal EMP has the L value, the amplitude amplifying circuit 4 does not change the voltage of the node N1. In this case, the high-level voltage VH equals the reference voltage Vref1. That is, with the H value, the emphasis signal EMP activates the amplitude amplification of the amplitude amplifying circuit 4. Further, with the L value, the emphasis signal EMP deactivates the amplitude amplification of the amplitude amplifying circuit 4. The amplitude amplifying circuit 4 in FIG. 7 includes transistors M13 and M14.

The transistor M13 (i.e., a thirteenth transistor) is an NMOS having a drain terminal (i.e., a first terminal) connected to the high-voltage power supply, a source terminal (i.e., a second terminal) connected to a drain terminal of the transistor M14, and a gate terminal (i.e., a control terminal) that is applied with a reference voltage VRN (i.e., a fifth reference voltage) higher than the gate voltage of the transistor M1. The transistor M13 functions as a source follower.

The transistor M14 (i.e., a fourteenth transistor) is an NMOS having a drain terminal (i.e., a first terminal) connected to the source terminal (i.e., the second terminal) of the transistor M13, a source terminal (i.e., a second terminal) connected to the node N1 of the output circuit 1, and a gate terminal (i.e., a control terminal) that receives an input of the emphasis signal EMP. That is, the gate terminal of the transistor M14 is applied with a voltage corresponding to the value of the emphasis signal EMP. The source terminal of the transistor M14 corresponds to an output terminal of the amplitude amplifying circuit 4. The transistor M14 functions as a switch.

If the emphasis signal EMP has the L value, the transistor M14 is turned off, increasing the output impedance of the amplitude amplifying circuit 4, and cutting off the transistor M13 from the output circuit 1. Consequently, the voltage of the node N1 is unchanged, making the high-level voltage VH equal to the reference voltage Vref1.

If the emphasis signal EMP has the H value, the transistor M14 is turned on. Thus, the transistor M13 is connected to the output circuit 1 via the transistor M14, and functions as a source follower connected in parallel to the transistor M1. Consequently, the size of source followers connected to the node N1 is increased as compared with that in the case in which the amplitude amplification is deactivated. Accordingly, the voltage of the node N1 is increased, making the high-level voltage VH equal to the reference voltage Vref3.

It is possible to set the reference voltage Vref3 to a desired value through adjustment of the reference voltage VRN. The configuration of the amplitude amplifying circuit 4 is not limited to that illustrated in the example of FIG. 7.

The amplitude amplifying circuit 5 (i.e., a second amplitude amplifying circuit) amplifies the amplitudes of the output signals Voutp and Voutm in accordance with the emphasis signal EMP. Specifically, the amplitude amplifying circuit 5 controls the voltage of the node N2 to make at least a part of the low-level voltage VL equal to a reference voltage Vref4 (i.e., a fourth reference voltage), i.e., VL=Vref4. The reference voltage Vref4 is lower than the reference voltage Vref2.

If the emphasis signal EMP has the H value, the amplitude amplifying circuit 5 reduces the voltage of the node N2 to reduce the low-level voltage VL to the reference voltage Vref4. Thereby, the amplitudes of the output signals Voutp and Voutm are increased. If the emphasis signal EMP has the L value, the amplitude amplifying circuit 5 does not change the voltage of the node N2. In this case, the low-level voltage VL equals the reference voltage Vref2. That is, with the H value, the emphasis signal EMP activates the amplitude amplification of the amplitude amplifying circuit 5. Further, with the L value, the emphasis signal EMP deactivates the amplitude amplification of the amplitude amplifying circuit 5. The amplitude amplifying circuit 5 in FIG. 7 includes transistors M15 and M16.

The transistor M15 (i.e., a fifteenth transistor) is a PMOS having a drain terminal (i.e., a first terminal) connected to the ground, a source terminal (i.e., a second terminal) connected to a source terminal (i.e., a second terminal) of the transistor M16, and a gate terminal (i.e., a control terminal) that is applied with a reference voltage VRP (i.e., a sixth reference voltage) lower than the gate voltage of the transistor M2. The transistor M15 functions as a source follower.

The transistor M16 (i.e., a sixteenth transistor) is an NMOS having a drain terminal (i.e., a first terminal) connected to the node N2 of the output circuit 1, a source terminal (i.e., a second terminal) connected to the source terminal (i.e., the second terminal) of the transistor M15, and a gate terminal (i.e., a control terminal) that receives an input of the emphasis signal EMP. That is, the gate terminal of the transistor M16 is applied with a voltage corresponding to the value of the emphasis signal EMP. The drain terminal of the transistor M16 corresponds to an output terminal of the amplitude amplifying circuit 5. The transistor M16 functions as a switch.

If the emphasis signal EMP has the L value, the transistor M16 is turned off, increasing the output impedance of the amplitude amplifying circuit 5, and cutting off the transistor M15 from the output circuit 1. Consequently, the voltage of the node N2 is unchanged, making the low-level voltage VL equal to the reference voltage Vref2.

If the emphasis signal EMP has the H value, the transistor M16 is turned on. Thus, the transistor M15 is connected to the output circuit 1 via the transistor M16, and functions as a source follower connected in parallel to the transistor M2. Consequently, the size of source followers connected to the node N2 is increased as compared with that in the case in which the amplitude amplification is deactivated. Accordingly, the voltage of the node N2 is reduced, making the low-level voltage VL equal to the reference voltage Vref4.

It is possible to set the reference voltage Vref4 to a desired value through adjustment of the reference voltage VRP. The configuration of the amplitude amplifying circuit 5 is not limited to that illustrated in the example of FIG. 7. Further, the LVDS driver 102 may include only one of the amplitude amplifying circuits 4 and 5.

The emphasis signal generating circuit 6 generates the input signals Vinp and Vinm and the emphasis signal EMP based on input data D, a clock signal CLK, and an emphasis setting signal EMPON input to the emphasis signal generating circuit 6. The input signals Vinp and Vinm generated by the emphasis signal generating circuit 6 are input to the output circuit 1. Further, the emphasis signal EMP generated by the emphasis signal generating circuit 6 is input to the amplitude amplifying circuits 4 and 5.

The input data D is digital data to be transmitted by the LVDS driver 102, and has the H value or the L value. The clock signal CLK periodically changes between the H value and the L value. The emphasis setting signal EMPON is a digital signal for activating or deactivating the amplitude amplification of the amplitude amplifying circuits 4 and 5, and has the H value or the L value. With the H value, the emphasis setting signal EMPON enables the activation of the amplitude amplification of the amplitude amplifying circuits 4 and 5. With the L value, the emphasis setting signal EMPON disables the activation of the amplitude amplification of the amplitude amplifying circuits 4 and 5, i.e., deactivates the amplitude amplification of the amplitude amplifying circuits 4 and 5.

Figure 8:
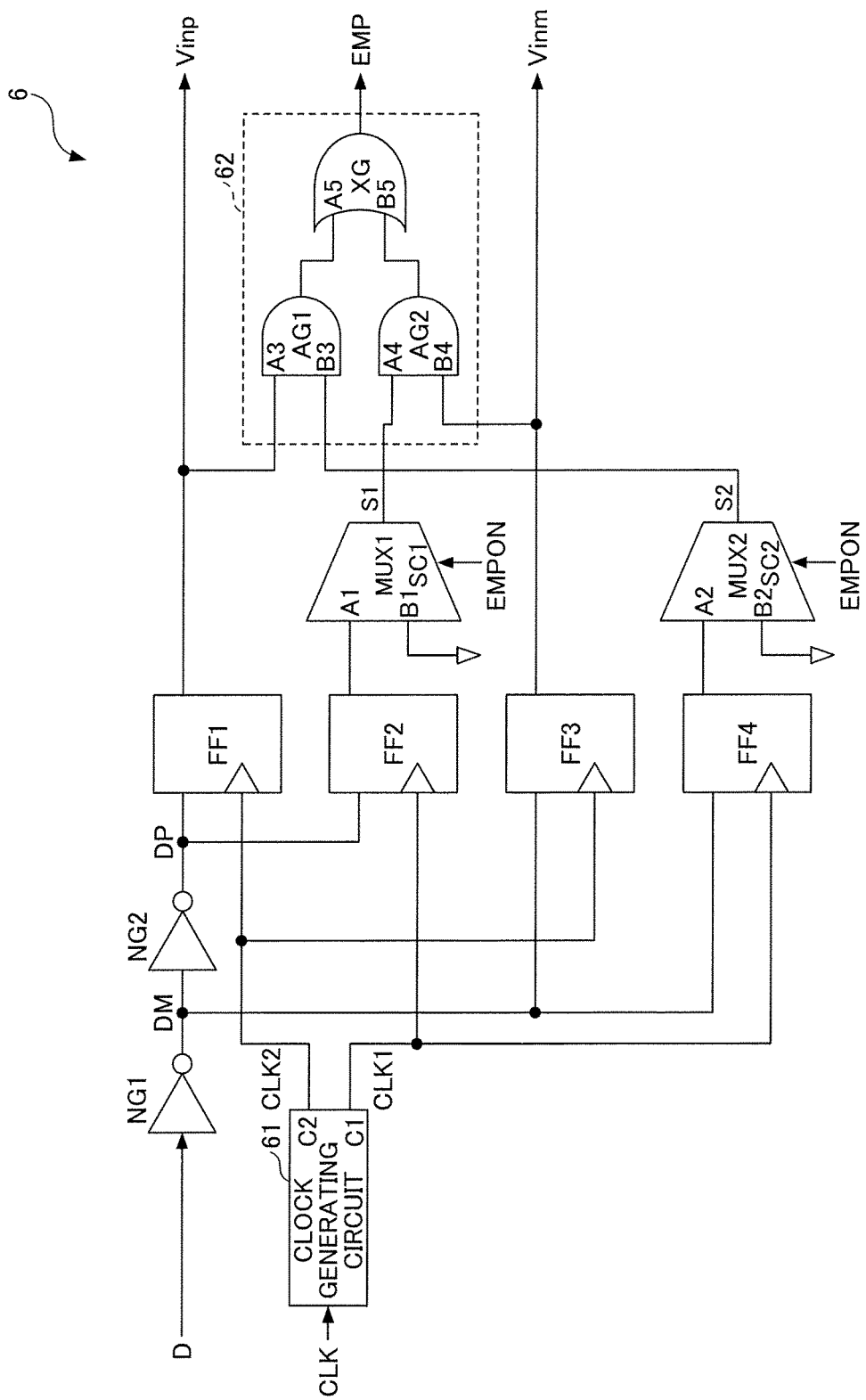
FIG. 8 is a diagram illustrating an example of an emphasis signal generating circuit of the LVDS driver according to the third embodiment.

FIG. 8 is a diagram illustrating an example of the emphasis signal generating circuit 6. The emphasis signal generating circuit 6 in FIG. 8 includes a clock generating circuit 61, NOT gates NG1 and NG2, flip-flop circuits FF1, FF2, FF3, and FF4, multiplexers MUX1 and MUX2, and a logic circuit 62 including AND gates AG1 and AG2 and an XOR gate XG.

The clock generating circuit 61 generates a clock signal CLK1 (i.e., a first clock signal) and a clock signal CLK2 (i.e., a second clock signal) based on the clock signal CLK. The clock generating circuit 61 is a combination of a delay circuit, a delay-locked loop (DLL) circuit, and a phase-locked loop (PLL) circuit, for example. The clock signals CLK1 and CLK2 have different phases; the phase of the clock signal CLK1 is more advanced than the phase of the clock signal CLK2 by a predetermined phase difference. The emphasis signal generating circuit 6 generates the emphasis signal EMP having a width according to the phase difference between the clock signals CLK1 and CLK2 (i.e., a width corresponding to the period of the H value).

The clock generating circuit 61 includes an input terminal that receives an input of the clock signal CLK, a first output terminal C1 connected to respective clock input terminals of the flip-flop circuits FF2 and FF4 to output the clock signal CLK1, and a second output terminal C2 connected to respective clock input terminals of the flip-flop circuits FF1 and FF3 to output the clock signal CLK2. The input terminal of the clock generating circuit 61 corresponds to an input terminal of the emphasis signal generating circuit 6.

The NOT gate NG1 is a logic gate that outputs the inverse of the input data D as negative data DM. The NOT gate NG1 includes an input terminal that receives an input of the input data D, and an output terminal connected to an input terminal of the NOT gate NG2 and respective D-input terminals of the flip-flop circuits FF3 and FF4 to output the negative data DM. The input terminal of the NOT gate NG1 corresponds to an input terminal of the emphasis signal generating circuit 6.

The NOT gate NG2 is a logic gate that outputs the inverse of the negative data DM as positive data DP. The NOT gate NG2 includes an input terminal connected to the output terminal of the NOT gate NG1 to receive an input of the negative data DM, and an output terminal connected to respective D-input terminals of the flip-flop circuits FF1 and FF2 to output the positive data DP.

The flip-flop circuit FF1 is a D-type flip-flop circuit including a D-input terminal connected to the output terminal of the NOT gate NG2 to receive an input of the positive data DP, a clock input terminal connected to the second output terminal C2 of the clock generating circuit 61 to receive an input of the clock signal CLK2, and an output terminal connected to the input terminal Tinp of the output circuit 1 and a first input terminal A3 of the AND gate AG1. The output terminal of the flip-flop circuit FF1 corresponds to an output terminal of the emphasis signal generating circuit 6. The flip-flop circuit FF1 retains the value of the positive data DP at the rise of the clock signal CLK2, and outputs the retained value as the input signal Vinp.

The flip-flop circuit FF2 is a D-type flip-flop circuit including a D-input terminal connected to the output terminal of the NOT gate NG2 to receive an input of the positive data DP, a clock input terminal connected to the first output terminal C1 of the clock generating circuit 61 to receive an input of the clock signal CLK1, and an output terminal connected to a first input terminal A1 of the multiplexer MUX1. The flip-flop circuit FF2 retains the value of the positive data DP at the rise of the clock signal CLK1, and outputs the retained value.

The flip-flop circuit FF3 is a D-type flip-flop circuit including a D-input terminal connected to the output terminal of the NOT gate NG1 to receive an input of the negative data DM, a clock input terminal connected to the second output terminal C2 of the clock generating circuit 61 to receive an input of the clock signal CLK2, and an output terminal connected to the input terminal Tinm of the output circuit 1 and a second input terminal B4 of the AND gate AG2. The output terminal of the flip-flop circuit FF3 corresponds to an output terminal of the emphasis signal generating circuit 6. The flip-flop circuit FF3 retains the value of the negative data DM at the rise of the clock signal CLK2, and outputs the retained value as the input signal Vinm.

The flip-flop circuit FF4 is a D-type flip-flop circuit including a D-input terminal connected to the output terminal of the NOT gate NG1 to receive an input of the negative data DM, a clock input terminal connected to the first output terminal C1 of the clock generating circuit 61 to receive an input of the clock signal CLK1, and an output terminal connected to a first input terminal A2 of the multiplexer MUX2. The flip-flop circuit FF4 retains the value of the negative data DM at the rise of the clock signal CLK1, and outputs the retained value.

The multiplexer MUX1 is a 2-input multiplexer including a first input terminal A1 connected to the output terminal of the flip-flop circuit FF2, a second input terminal B1 connected to the ground, a selection control input terminal SC1 that receives an input of the emphasis setting signal EMPON, and an output terminal connected to a first input terminal A4 of the AND gate AG2 to output an output signal S1. The selection control input terminal SC1 corresponds to an input terminal of the emphasis signal generating circuit 6. If the emphasis setting signal EMPON has the H value, the output signal of the flip-flop circuit FF2 input to the first input terminal A1 is output as the output signal S1 by the multiplexer MUX1. If the emphasis setting signal EMPON has the L value, the ground voltage with the L value input to the second input terminal B1 is output as the output signal S1 by the multiplexer MUX1.

The multiplexer MUX2 is a 2-input multiplexer including a first input terminal A2 connected to the output terminal of the flip-flop circuit FF4, a second input terminal B2 connected to the ground, a selection control input terminal SC2 that receives an input of the emphasis setting signal EMPON, and an output terminal connected to a second input terminal B3 of the AND gate AG1 to output an output signal S2. The selection control input terminal SC2 corresponds to an input terminal of the emphasis signal generating circuit 6. If the emphasis setting signal EMPON has the H value, the output signal of the flip-flop circuit FF4 input to the first input terminal A2 is output as the output signal S2 by the multiplexer MUX2. If the emphasis setting signal EMPON has the L value, the ground voltage with the L value input to the second input terminal B2 is output as the output signal S2 by the multiplexer MUX2.

The logic circuit 62 generates the emphasis signal EMP based on the signals output from the flip-flop circuits FF1 and FF3 and the multiplexers MUX1 and MUX2.

The AND gate AG1 is a logic gate that outputs the H value if the input signal Vinp and the output signal S2 both have the H value, and outputs the L value otherwise. The AND gate AG1 includes a first input terminal A3 connected to the output terminal of the flip-flop circuit FF1, a second input terminal B3 connected to the output terminal of the multiplexer MUX2, and an output terminal connected to a first input terminal A5 of the XOR gate XG.

The AND gate AG2 is a logic gate that outputs the H value if the input signal Vinm and the output signal S1 both have the H value, and outputs the L value otherwise. The AND gate AG2 includes a first input terminal A4 connected to the output terminal of the multiplexer MUX1, a second input terminal B4 connected to the output terminal of the flip-flop circuit FF3, and an output terminal connected to a second input terminal B5 of the XOR gate XG.

The XOR gate XG is a logic gate that outputs the H value if one of the output signal of the AND gate AG1 and the output signal of the AND gate AG2 has the H value, and outputs the L value otherwise. The XOR gate XG includes a first input terminal A5 connected to the output terminal of the AND gate AG1, a second input terminal B5 connected to the output terminal of the AND gate AG2, and an output terminal connected to the gate terminal of the transistor M14 of the amplitude amplifying circuit 4 and the gate terminal of the transistor M16 of the amplitude amplifying circuit 5 in FIG. 7 to output the emphasis signal EMP. The output terminal of the XOR gate XG corresponds to an output terminal of the emphasis signal generating circuit 6.

The configuration of the emphasis signal generating circuit 6 is not limited to that illustrated in the example of FIG. 7. Further, the input data D, the clock signal CLK, and the emphasis setting signal EMPON may be input from an external device, or may be generated inside the LVDS driver 102 and input to the emphasis signal generating circuit 6.

An operation of the LVDS driver 102 according to the third embodiment will now be described.

Figure 9:
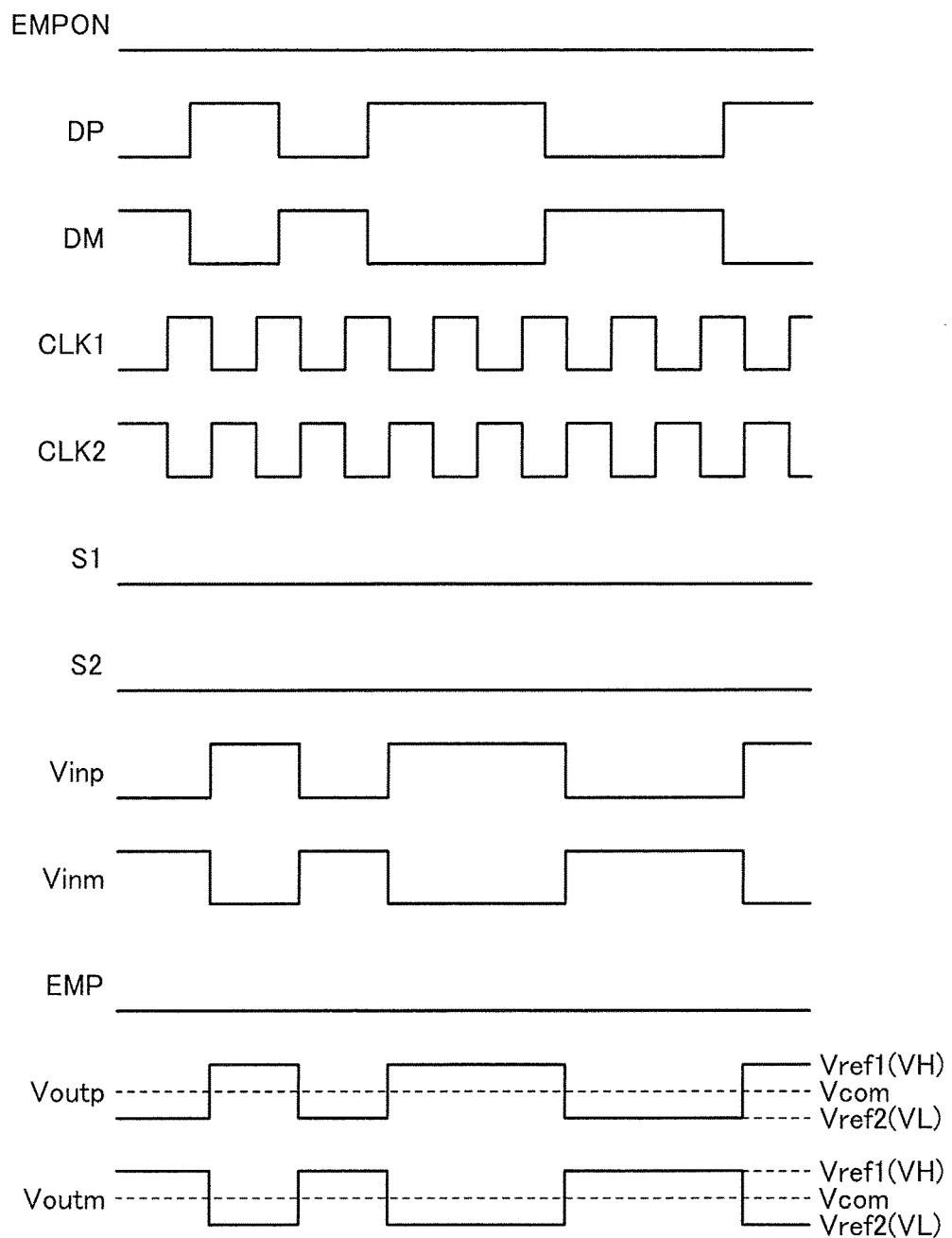
FIGS. 9 to 11 are timing charts illustrating examples of transition of signals in the LVDS driver according to the third embodiment.
Figure 10:
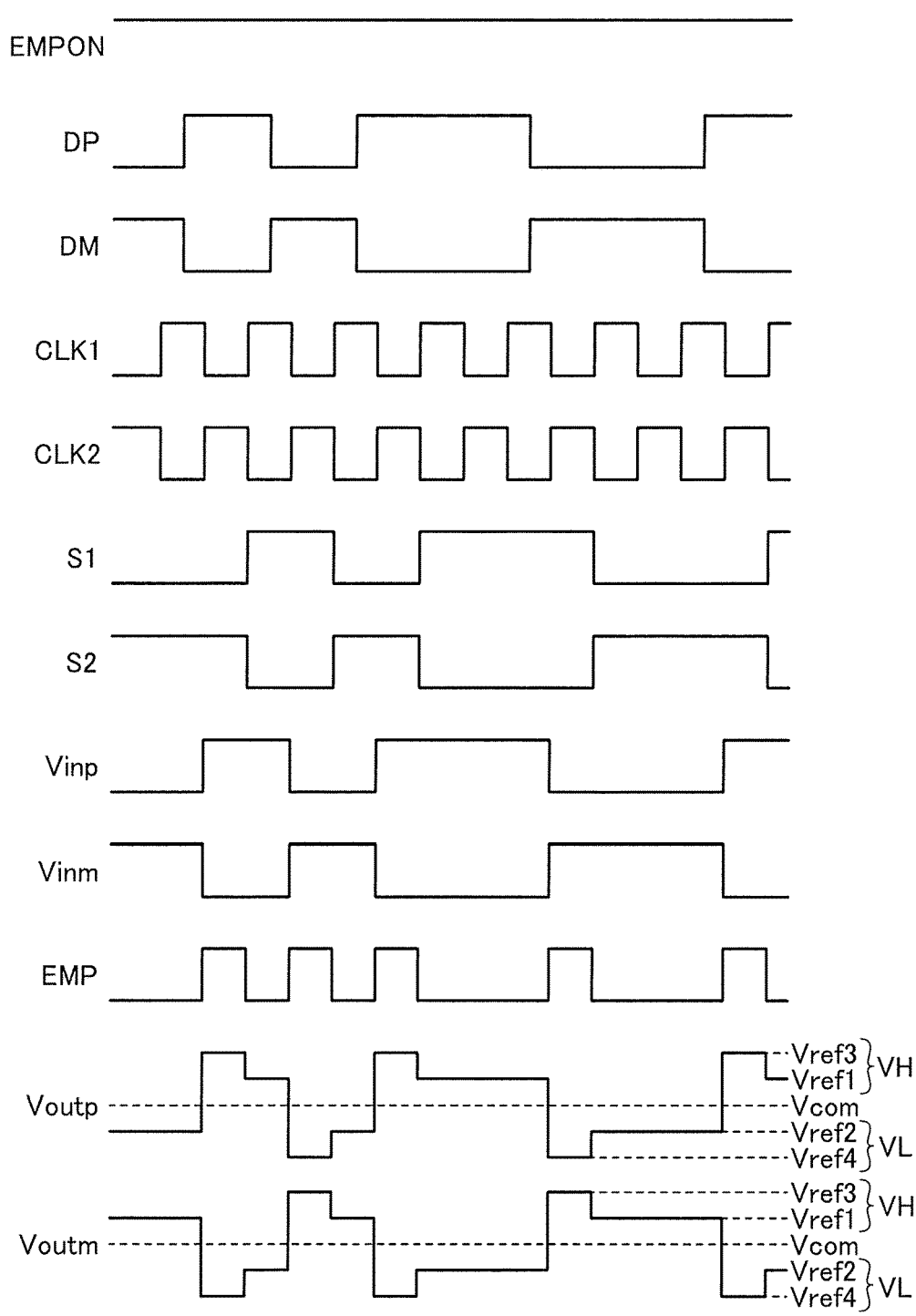
Figure 11:
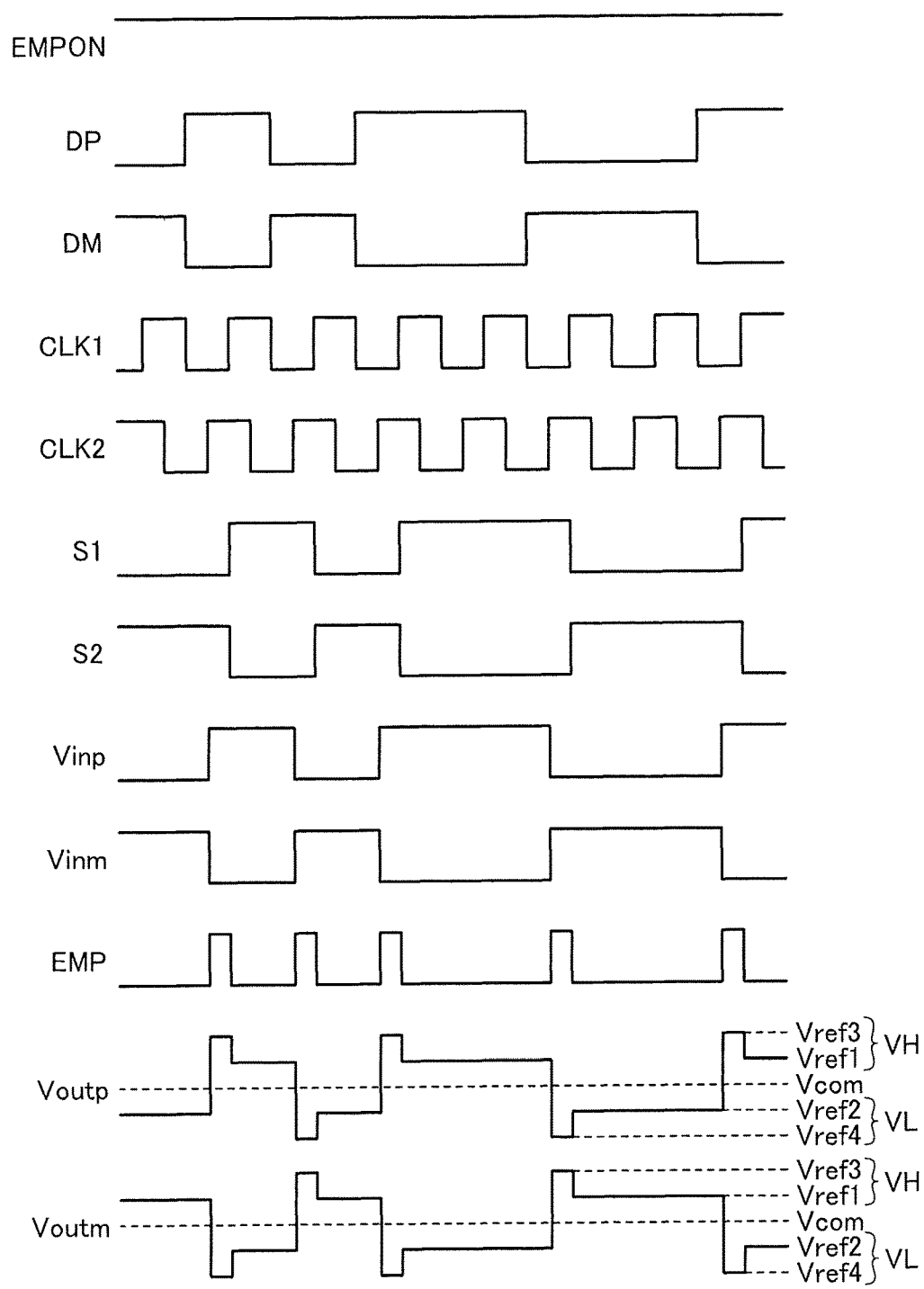

FIGS. 9 to 11 are timing charts illustrating examples of transition of signals in the LVDS driver 102. FIG. 9 is a timing chart obtained when the emphasis setting signal EMPON has the L value, and the phase difference between the clock signals CLK1 and CLK2 is 180 degrees. FIG. 10 is a timing chart obtained when the emphasis setting signal EMPON has the H value, and the phase difference between the clock signals CLK1 and CLK2 is 180 degrees. FIG. 11 is a timing chart obtained when the emphasis setting signal EMPON has the H value, and the phase difference between the clock signals CLK1 and CLK2 is 270 degrees.

As described above, the input signal Vinp is the output signal of the flip-flop circuit FF1, and the input signal Vinm is the output signal of the flip-flop circuit FF3. Therefore, the respective values of the input signals Vinp and Vinm change in synchronization with the clock signal CLK2. Further, the input signal Vinp has the value according to the positive data DP, and the input signal Vinm has the value according to the negative data DM, which is the inverse of the positive data DP. As illustrated in FIGS. 9 to 11, therefore, the input signals Vinp and Vinm are inverted signals of each other synchronizing with the clock signal CLK2.

As in the example of FIG. 9, if the emphasis setting signal EMPON has the L value, the output signals S1 and S2 have the L value. Thus, the output signals of the AND gates AG1 and AG2 have the L value, and the output signal of the XOR gate XG, i.e., the emphasis signal EMP, has the L value. Consequently, the amplitude amplification of the amplitude amplifying circuits 4 and 5 does not take place, making the high-level voltage VH and the low-level voltage VL of the output signals Voutp and Voutm equal to the reference voltage Vref1 and the reference voltage Vref2, respectively, as illustrated in FIG. 9. That is, if the emphasis setting signal EMPON has the L value, the output signals Voutp and Voutm described in the first embodiment are output.

As in the example of FIG. 10, if the emphasis setting signal EMPON has the H value, the output signal S1 corresponds to the output signal of the flip-flop circuit FF2, and the output signal S2 corresponds to the output signal of the flip-flop circuit FF4. As described above, the respective values of the output signals of the flip-flop circuits FF2 and FF4 change in synchronization with the clock signal CLK1. Further, the output signal of the flip-flop circuit FF2 has the value according to the positive data DP, and the output signal of the flip-flop circuit FF4 has the value according to the negative data DM, which is the inverse of the positive data DP. As illustrated in FIG. 10, therefore, the output signals S1 and S2 are inverted signals of each other synchronizing with the clock signal CLK1.

Since the phase difference between the clock signals CLK1 and CLK2 is 180 degrees in the example of FIG. 10, the phase of the output signals S1 and S2 is more advanced than the phase of the input signals Vinp and Vinm by 180 degrees (i.e., by half the period of the clock signals CLK1 and CLK2). In the example of FIG. 10, therefore, the emphasis signal EMP has the H value, i.e., the amplitude amplification of the amplitude amplifying circuits 4 and 5 takes place, for half the period of the clock signals CLK1 and CLK2 from the rise of the input signal Vinp or Vinm.

Consequently, as illustrated in FIG. 10, the high-level voltage VH of the output signals Voutp and Voutm is equal to the reference voltage Vref3 for half the period of the clock signals CLK1 and CLK2 from the rise of the input signal Vinp or Vinm, and is equal to the reference voltage Vref1 for the other periods. Further, the low-level voltage VL of the output signals Voutp and Voutm is equal to the reference voltage Vref4 for half the period of the clock signals CLK1 and CLK2 from the rise of the input signal Vinp or Vinm, and is equal to the reference voltage Vref2 for the other periods. In sum, according to the third embodiment, if the phase difference between the clock signals CLK1 and CLK2 corresponds to half the period of the clock signals CLK1 and CLK2, the emphasis signal EMP having a width corresponding to half the period is generated, and the amplitudes of the output signals Voutp and Voutm are amplified for half the period.

In the example of FIG. 11, the phase difference between the clock signals CLK1 and CLK2 is 270 degrees. Thus, the phase of the output signals S1 and S2 is more advanced than the phase of the input signals Vinp and Vinm by 90 degrees (i.e., by a quarter of the period of the clock signals CLK1 and CLK2). In the example of FIG. 11, therefore, the emphasis signal EMP has the H value, i.e., the amplitude amplification of the amplitude amplifying circuits 4 and 5 takes place, for a quarter of the period of the clock signals CLK1 and CLK2 from the rise of the input signal Vinp or Vinm.

Consequently, as illustrated in FIG. 11, the high-level voltage VH of the output signals Voutp and Voutm is equal to the reference voltage Vref3 for a quarter of the period of the clock signals CLK1 and CLK2 from the rise of the input signal Vinp or Vinm, and is equal to the reference voltage Vref1 for the other periods. Further, the low-level voltage VL of the output signals Voutp and Voutm is equal to the reference voltage Vref4 for a quarter of the period of the clock signals CLK1 and CLK2 from the rise of the input signal Vinp or Vinm, and is equal to the reference voltage Vref2 for the other periods. In sum, according to the third embodiment, if the phase difference between the clock signals CLK1 and CLK2 corresponds to a quarter of the period of the clock signals CLK1 and CLK2, the emphasis signal EMP having a width corresponding to a quarter of the period is generated, and the amplitudes of the output signals Voutp and Voutm are amplified for a quarter of the period.

As described above, according the third embodiment, the amplitude amplifying circuits 4 and 5 amplify the amplitudes of the output signals Voutp and Voutm. Even if the amplitudes of the output signals Voutp and Voutm attenuate owing to a high-frequency loss occurring on a transmission line following the output circuit 1, the values of the output signals Voutp and Voutm, i.e., the input data D, are accurately transmitted.

Further, each of the amplitude amplifying circuit 4 and 5 is implementable by a simple configuration in which a transistor functioning as a source follower and a transistor functioning as a switch are connected in series.

Further, the width of the emphasis signal EMP, i.e., the active period of the amplitude amplification, is set to a desired value through the adjustment of the phase difference between the clock signals CLK1 and CLK2. If the active period of the amplitude amplification is set to be shorter than the 1-bit period of the input data D, an increase in power consumption due to the amplitude amplification is prevented. Further, if the clock generating circuit 61 includes a DLL circuit or a PLL circuit, the phase difference between the clock signals CLK1 and CLK2 is accurately adjusted to accurately set the active period of the amplitude amplification.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

The invention claimed is:

1. A low voltage differential signaling driver, comprising:
    at least one output circuit, each output circuit of the at least one output circuit including
        a first input terminal to receive an input of a first input signal,
        a second input terminal to receive an input of a second input signal,
        a first output terminal to output a first output signal,
        a second output terminal to output a second output signal,
        a first transistor having a first terminal connected to a high-voltage power supply, a second terminal connected to a first node, and a control terminal,
        a second transistor having a first terminal connected to a low-voltage power supply, a second terminal connected to a second node, and a control terminal,
        a third transistor having a first terminal connected to the first node, a second terminal connected to the first output terminal, and a control terminal connected to the first input terminal of the output circuit,
        a fourth transistor having a first terminal connected to the first node, a second terminal connected to the second output terminal, and a control terminal connected to the second input terminal of the output circuit,
        a fifth transistor having a first terminal connected to the first output terminal, a second terminal connected to the second node, and a control terminal connected to the second input terminal of the output circuit, and
        a sixth transistor having a first terminal connected to the second output terminal, a second terminal connected to the second node, and a control terminal connected to the first input terminal of the output circuit;
    a first control circuit, to which a first reference voltage is input, to control a voltage of the control terminal of the first transistor to make a voltage of the first output signal equal to the first reference voltage, when the first input signal has a first value;
    a second control circuit, to which a second reference voltage is input, to control a voltage of the control terminal of the second transistor to make the voltage of the first output signal equal to the second reference voltage when the first input signal has a second value; and
    an emphasis signal generating circuit to generate the first input signal, the second input signal, and an emphasis signal based on input data and a clock signal input to the emphasis signal generating circuit,
    wherein the second control circuit is separate from and is not connected to the first control circuit.

2. The low voltage differential signaling driver of claim 1, further comprising a first amplitude amplifying circuit to control a voltage of the first node in accordance with the emphasis signal to make at least a part of the voltage of the first output signal equal to a third reference voltage when the first input signal has the first value, the third reference voltage being higher than the first reference voltage.

3. The low voltage differential signaling driver of claim 1, further comprising a second amplitude amplifying circuit to control a voltage of the second node in accordance with the emphasis signal to make at least a part of the voltage of the first output signal equal to a fourth reference voltage when the first input signal has the second value, the fourth reference voltage being lower than the second reference voltage.

4. The low voltage differential signaling driver of claim 2, wherein the first amplitude amplifying circuit includes
    a thirteenth transistor having a first terminal connected to the high-voltage power supply, a second terminal, and a control terminal applied with a fifth reference voltage, and
    a fourteenth transistor having a first terminal connected to the second terminal of the thirteenth transistor, a second terminal connected to the first node, and a control terminal to receive an input of the emphasis signal.

5. The low voltage differential signaling driver of claim 3, wherein the second amplitude amplifying circuit includes
    a fifteenth transistor having a first terminal connected to the low-voltage power supply, a second terminal, and a control terminal applied with a sixth reference voltage, and
    a sixteenth transistor having a first terminal connected to the second node, a second terminal connected to the second terminal of the fifteenth transistor, and a control terminal to receive an input of the emphasis signal.

6. The low voltage differential signaling driver of claim 1, wherein the emphasis signal generating circuit includes a clock generating circuit to generate a first clock signal and a second clock signal based on the clock signal input to the emphasis signal generating circuit, the first clock signal and the second clock signal having a predetermined phase difference, and
    wherein the emphasis signal generating circuit generates the emphasis signal with a width according to the predetermined phase difference.

7. The low voltage differential signaling driver of claim 6, wherein the emphasis signal generating circuit further receives an input of an emphasis setting signal,
    wherein when the emphasis setting signal has the first value, the emphasis signal generating circuit generates the emphasis signal with one of the first value and the second value, and
    wherein when the emphasis setting signal has the second value, the emphasis signal generating circuit generates the emphasis signal with the second value.

8. A low voltage differential signal driver, comprising:
an output circuit including
- a first input terminal to receive an input of a first input signal;
- a second input terminal to receive an input of a second input signal; and
- switch circuitry disposed between a first transistor connected to a high-voltage power supply and a second transistor connected to a low-voltage power supply, the switch circuit having a first input and a second input;

a first control circuit into which a first reference voltage is input, and configured to drive the first transistor in the output circuit;

a second control circuit into which a second reference voltage is input, and configured to drive the second transistor in the output circuit; and an emphasis signal generating circuit to generate the first input signal, the second input signal, and an emphasis signal based on input data and a clock signal input to the emphasis signal generating circuit, wherein the second control circuit is separate from and is not connected to the first control circuit.

9. The low voltage differential signal driver according to claim 8, wherein:
the first control circuit drives the first transistor such that a voltage of a first output from the switch circuitry is equal to the first reference voltage, when the first input has a first value; and
the second control circuit drives the second transistor such that the voltage of the first output from the switch circuitry is equal to the second reference voltage, when the second input has a second value.

* * * * *